(12) United States Patent
Terao et al.

(10) Patent No.: US 8,525,159 B2
(45) Date of Patent: Sep. 3, 2013

(54) ORGANIC LIGHT EMITTING ELEMENT

(75) Inventors: Yutaka Terao, Matsumoto (JP); Koji Kawaguchi, Matsumoto (JP); Toshio Hama, Matsumoto (JP)

(73) Assignee: Sharp Kabushiki Kaisha, Osaka-Shi, Osaka (JP)

( * ) Notice: Subject to any disclaimer, the term of this patent is extended or adjusted under 35 U.S.C. 154(b) by 156 days.

(21) Appl. No.: 13/063,463

(22) PCT Filed: Sep. 11, 2009

(86) PCT No.: PCT/JP2009/065949
§ 371 (c)(1),
(2), (4) Date: Aug. 18, 2011

(87) PCT Pub. No.: WO2011/030450
PCT Pub. Date: Mar. 17, 2011

(65) Prior Publication Data
US 2011/0291082 A1    Dec. 1, 2011

(51) Int. Cl.
*H01L 35/24*    (2006.01)
(52) U.S. Cl.
USPC ................................. 257/40; 257/E51.001
(58) Field of Classification Search
USPC ............................................ 257/40, E51.001
See application file for complete search history.

(56) References Cited

U.S. PATENT DOCUMENTS

| | | |
|---|---|---|
| 4,769,292 A | 9/1988 | Tang et al. |
| 6,475,648 B1 | 11/2002 | Hatwar et al. |
| 2006/0055305 A1 | 3/2006 | Funahashi et al. |
| 2007/0285010 A1 | 12/2007 | Lee et al. |
| 2008/0258613 A1 | 10/2008 | Fukuoka et al. |

FOREIGN PATENT DOCUMENTS

| | | |
|---|---|---|
| JP | 63-264692 A | 11/1988 |
| JP | 2002-038140 A | 2/2002 |
| JP | 2004-171828 A | 6/2004 |
| JP | 2007-329454 A | 12/2007 |
| WO | WO-2009-119591 A1 | 10/2009 |

OTHER PUBLICATIONS

M. A. Baldo et al., "Very high-efficiency green organic light-emitting devices based on electrophosphorescence", Applied Physics Letters, vol. 75, No. 1, pp. 4-6 (1999).

J. Yu et al., "A Novel Blue Light Emitting Diode Using Tris(2,3-methyl-8-Hydroxyquinoline)Aluminum(III) as Emitter",Japan Journal of Applied Physics, vol. 38, No. 12A, pp. 6762-6763 (1999).

*Primary Examiner* — Anthony Ho
(74) *Attorney, Agent, or Firm* — Rabin & Berdo, P.C.

(57) ABSTRACT

An organic light emitting element includes a pair of electrodes at least one of which has visible light transmittance; and an organic EL layer provided between the pair of electrodes. The organic EL layer includes at least an organic light emitting layer that emits light when a voltage is applied between the pair of electrodes. The organic light emitting layer includes an electron transport host material; and at least first and second guest materials. Each of the first and second guest materials has an emission peak in a blue to blue-green color region. The electron transport host material has an ionization potential (IPH) and an electron affinity (AFH), and the first guest material has an ionization potential (IPG1) and an electron affinity (AFG1) that satisfy Expression (1): IPH≦IPG1 and AFH<AFG1 (1). The organic light emitting element has significantly improved efficiency without any influence on driving voltage.

6 Claims, No Drawings

ORGANIC LIGHT EMITTING ELEMENT

BACKGROUND OF THE INVENTION

1. Field of the Invention

The present invention relates to an organic light emitting element applicable to a flat panel display and to a light source for illumination. In particular, the invention relates to a high-efficiency organic light emitting element capable of reducing the power consumption of a display.

2. Background of the Related Art

In general, a color-conversion-type color display using an organic light emitting element employs an organic light emitting element (hereinafter, referred to as a blue to blue-green organic light emitting element), transmits blue light using a blue color filter for a blue pixel, and converts the wavelength of EL light using a color conversion layer to obtain red light for a red pixel.

For green, the color-conversion-type color display transmits a green component in the EL light using a color filter, or uses a color conversion layer for emitting green light to obtain green light.

As the organic light emitting element, the blue to blue-green organic light emitting element is used for each of the red, green, and blue pixels. Therefore, in the color-conversion-type display, the emission efficiency of the blue to blue-green organic light emitting element has a great influence on the performance of the display, such as power consumption.

As a means for improving the emission efficiency of the organic light emitting element, a method has been proposed in which a material obtained by doping a host material with a guest material is used to form a light emitting layer, for example, see Japanese Patent Application Laid-Open (JP-A) No. S63-26469. This method transfers energy from the host material excited by the recombination of holes and electrons to the guest material to emit fluorescence from the guest material. Since the guest material is doped at a low concentration of several percent, concentration quenching by the reaction between the guest materials does not occur and it is possible to emit light from the guest material substantially in an ideal stage. Factors determining the emission efficiency of this method include, for example, the probability that singlet excitons will be generated by recombination on the host material, the transfer efficiency of energy to the guest material, and the fluorescence quantum yield of the guest material.

As a method of further improving efficiency, a method of using phosphorescence has been proposed, for example, see M. A. Baldo, S. Lamansky, P. E. Burrows, M. E. Thompson and S. R. Forrest, Applied Physics Letters, volume 75, issue 1, p.4 (1999). Since phosphorescence is the emission of light in a triplet state, the probability that the excitons will be generated is high and it is possible to greatly improve emission efficiency.

In addition, there is an attempt to develop a technique for improving the efficiency and reliability of a fluorescent organic light emitting element using the above-mentioned doping technique. For example, a technique has been proposed which forms an organic EL layer with a host material including a first dopant capable of accepting electron/hole binding energy and a second dopant capable of trapping holes, for example, see JP-A No. 2002-38140.

As another example, two kinds of organic light emitting elements have been disclosed in which a light emitting layer includes a host material and first and second dopants satisfying the following relationships, for example, see JP-A No. 2002-38140, and one of the two kinds of organic light emitting elements satisfies the following conditions:

$$EV0 > EV1 \text{ and } EV0 > EV2 \quad (A)$$

$$EC0 \geq EC2 \quad (B)$$

$$Eg0 > Eg1, Eg2, \quad (C)$$

wherein $EV0$, $EV1$, and $EV2$ indicate the valence electron levels of the host material, the first dopant, and the second dopant, respectively, $EC0$ and $EC2$ indicate the conduction levels of the host material and second dopant, respectively, and $Eg0$, $Eg1$, and $Eg2$ indicate the energy gaps of a light emitting layer material, the first dopant, and the second dopant, respectively.

The other of the two kinds of organic light emitting element satisfies the following conditions:

$$EV0 > EV1 \text{ and } EV0 > EV2 \quad (A')$$

$$EC0 \geq EC1, EC2, \quad (B')$$

wherein $EV0$, $EV1$, and $EV2$ indicate the valence electron levels of the host material, the first dopant, and the second dopant, respectively, and $EC0$, $EC1$, and $EC2$ indicate the conduction levels of the host material, the first dopant, and the second dopant, respectively.

However, in the phosphorescence method disclosed in M. A. Baldo, S. Lamansky, P. E. Burrows, M. E. Thompson and S. R. Forrest, Applied Physics Letters, volume 75, issue 1, p.4 (1999), when blue to blue-green light required for the color conversion type is emitted, a host material having triplet energy suitable to emit blue to blue-green light, that is, having a large band gap, is needed. However, at present, the choice of the host material is limited and a substantial host material capable of obtaining both high emission efficiency and driving stability has not been proposed yet. In addition, for driving stability, since the duration of phosphorescence is longer than that of fluorescence, a light emitting material in an excited state is likely to react with another material to be quenched. As a result, the lifespan of the material is reduced. Therefore, a breakthrough is needed in order to put the host material to practical use.

In the example of the technique disclosed in JP-A No. 2002-38140, emission efficiency and emission lifetime are improved, as compared to the example in which only one kind of dopant is used. However, JP-A No. 2002-38140 does not disclose an example in which the technique is applied to a blue to blue-green organic light emitting element. In addition, the organic light emitting element having a structure in which two kinds of dopants both can emit light further includes a carrier transport dopant to improve the emission efficiency and emission lifetime, but has a problem in that the driving voltage is substantially high. This is because the two kinds of dopants both have the property of capturing electrons.

The blue to blue-green organic light emitting element disclosed in JP-A No. 2004-171828 is capable of improving brightness efficiency and increasing driving lifetime, without increasing the driving voltage, as can be seen from the comparison between examples and comparative examples. However, the brightness efficiency and the driving lifespan are performance levels that can also be obtained by the use of a single dopant. Therefore, a noticeable effect is not obtained.

The invention has been made in view of the above-mentioned problems, and an object of the invention is to provide a blue to blue-green organic light emitting element having high brightness, high efficiency, and a long lifespan.

SUMMARY OF THE INVENTION

The inventors have conducted a study on a technique capable of improving the efficiency of a blue to blue-green organic light emitting element using fluorescence, thereby realizing the invention.

That is, according to an aspect of the invention, an organic light emitting element includes a pair of electrodes at least one of which has visible light transmittance; and an organic EL layer provided between the pair of electrodes that includes at least an organic light emitting layer that emits light when a voltage is applied between the pair of electrodes. The organic light emitting layer includes an electron transport host material; and at least first and second guest materials. Each of the first and second guest materials has an emission peak in a blue to blue-green color region. The electron transport host material has an ionization potential (IPH) and an electron affinity (AFH), and the first guest material has an ionization potential (IPG1) and an electron affinity (AFG1) that satisfy Expression (1) as follows:

$$IPH \leq IPG1 \text{ and } AFH < AFG1 \qquad (1).$$

According to the organic light emitting element of the invention, it is possible to achieve high efficiency without any influence on a driving voltage.

DETAILED DESCRIPTION OF THE INVENTION

Hereinafter, exemplary embodiments of the invention will be described in detail.
(Organic EL Layer)
An organic EL layer includes at least an organic light emitting layer and further includes a hole injection layer, a hole transport layer, an electron transport layer, and/or an electron injection layer, as required. Specifically, the organic EL layer has the following layer structure. In the following description, the layer structure also includes an anode and a cathode, and the organic EL layer is interposed between the anode and the cathode. In addition, each of the anode and the cathode is a reflecting electrode or a transparent electrode.
(1) Anode/organic light emitting layer/cathode
(2) Anode/hole injection layer/organic light emitting layer/cathode
(3) Anode/organic light emitting layer/electron injection layer/cathode
(4) Anode/hole injection layer/organic light emitting layer/electron injection layer/cathode
(5) Anode/hole transport layer/organic light emitting layer/electron injection layer/cathode
(6) Anode/hole injection layer/hole transport layer/organic light emitting layer/electron injection layer/cathode
(7) Anode/hole injection layer/hole transport layer/organic light emitting layer/electron transport layer/electron injection layer/cathode
(Transparent Electrode (Anode))
For the pair of electrodes according to the invention, an electrode having visible light transmittance is referred to as a transparent electrode. The transparent electrode may be made of an indium-tin oxide (ITO), a tin oxide, an indium oxide, an indium-zinc oxide (IZO), an indium-tungsten oxide (IWO), a zinc oxide, a zinc-aluminum oxide, a zinc-gallium oxide, or a conductive transparent metal oxide obtained by adding a dopant, such as F or Sb, to these oxides. The transparent electrode may be formed by a vapor deposition method, a sputtering method, or a chemical vapor deposition (CVD) method.
(Hole Injection Layer)
A material that can be used to form the hole injection layer of the organic light emitting element according to the invention includes a hole transport material used for a conventional organic EL element or organic TFT element, such as a material having a triarylamine moiety, a carbazole moiety, or an oxadiazole moiety.

Specifically, examples of the hole transport material include N,N'-diphenyl-N,N'-bis(3-methylphenyl)-1,1'-biphenyl-4,4'-diamine (TPD), N,N,N',N'-tetrakis(4-methoxyphenyl)-benzidine (MeO-TPD), 4,4',4''-tris{1-naphthyl (phenyl)amino}triphenylamine (1-TNATA), 4,4',4''-tris{2-naphthyl(phenyl)amino}triphenylamine (2-TNATA), 4,4',4''-tris(3-methylphenylphenylamino)triphenylamine (m-MTDATA), 4,4'-bis{N-(1-naphthyl)-N-phenylamino}biphenyl (NPB), 2,2',7,7'-tetrakis(N,N-diphenylamino)-9,9'-spirobifluorene (Spiro-TAD), N,N'-di(biphenyl-4-yl)-N,N'-diphenyl-(1,1'-biphenyl)-4,4'-diamine (p-BPD), tri(o-terphenyl-4-yl)amine (o-TTA), tri(p-terphenyl-4-yl)amine (p-TTA), 1,3,5-tris[4-(3-methylphenylphenylamino)phenyl]benzene (m-MTDAPB), and 4,4',4''-tris-9-carbazolyltriphenylamine (TCTA).
The hole injection layer may be made of, for example, hole transport materials produced by each organic electronic material manufacturer, in addition to these general materials.
The hole injection layer may be made of a material obtained by adding an electron-accepting dopant to the hole transport material (p-type doping). The electron-accepting dopant may be an organic semiconductor or an inorganic semiconductor. Examples of the available organic semiconductor include tetracyanoquinodimethane derivatives, such as 2,3,5,6-tetrafluoro-7,7,8,8-tetracyanoquinodimethane ($F_4$-TCNQ). Examples of the inorganic semiconductor include a molybdenum oxide ($MoO_3$), a tungsten oxide ($WO_3$), and a vanadium oxide ($V_2O_5$).
A thin film including the above-mentioned electron-accepting dopant may be formed on the anode to form the hole injection layer.
The hole injection layer may be formed by any method known in the technical field, such as a vapor deposition method, particularly, a resistance heating vapor deposition method. When the electron-accepting dopant is added, the hole injection layer may be formed by, for example, a co-evaporation method of heating and evaporating the dopant material and the hole transport material in a vacuum chamber at the same time to be deposited. When an inorganic oxide thin film made of, for example, a molybdenum oxide is used, a film forming method, such as electron beam deposition or sputtering, other than the resistance heating vapor deposition is appropriately used.
(Hole Transport Layer)
As a material used to form the hole transport layer of the organic EL element according to the invention, any material may be selected from the known materials used as the hole transport materials forming the organic EL element or the organic TFT, which are exemplified in the hole injection layer.
The hole transport layer may be formed by any method known in the technical field, such as a vapor deposition method, particularly, a resistance heating vapor deposition method.
(Organic Light Emitting Layer)
In the invention, the organic light emitting layer includes an electron transport host material and at least first and second guest materials. The electron transport host material has an ionization potential (IPH) and electron affinity (AFH), and the first guest material has an ionization potential (IPG1) and an electron affinity (AFG1) that satisfy Expression (1) as follows:

$$IPH \leq IPG1 \text{ and } AFH < AFG1 \qquad (1).$$

It is considered that the organic light emitting layer of the organic light emitting element according to the invention can have a mechanism in which singlet excitons are directly generated in the first guest material and light is emitted, in addition to a mechanism in which the excitation energy of the singlet excitons generated in the host material is transferred to the guest material and light is emitted. Therefore, it is considered that the amount of excitons generated from the entire organic light emitting layer can be increased and it is possible to obtain high emission efficiency that cannot be obtained in the organic light emitting layer made of a single guest material.

According to the inventors' examination, in the light emitting layer of a blue or blue-green element made of, for example, an anthracene-based host material that generally has high efficiency, electrons and holes do not equally move, but electrons dominantly move, so that a recombination region is displaced to be closer to the hole transport layer. In this case, even when the first guest material satisfies IPH≦IPG1 as in Expression (1), which is the necessary condition of the invention, and does not have a hole trapping property, it is possible to directly form excitons on the first guest material since the first guest material satisfies AFH<AFG1 and has an electron trapping property.

In addition, it is considered that the displacement of the recombination region is reduced by giving the electron trapping property, without giving the hole trapping property to the light emitting layer, which contributes to obtaining high efficiency and high reliability.

In the organic light emitting element according to the invention, the first guest material may have an optical band gap (EGG1) and the electron transport host material may have an optical band gap (EGH) that satisfy Expression (2) as follows:

$$EGH>EGG1 \qquad (2).$$

In order to directly generate the singlet excitons in the first guest material and emit light, the optical band gap (EGG1) of the first guest material and the optical band gap (EGH) of the host material need to satisfy Expression (2). When Expression (2) is satisfied, light can be effectively emitted from the first guest material. In this case, it is possible to prevent the unnecessary transfer of energy from the first guest material to the host material.

In the organic light emitting element according to the invention, it is considered that the first guest material traps electrons, such that the singlet excitons are directly generated and light is emitted. However, since the first guest material has an electron trapping property, the driving voltage of the organic light emitting element increases when the doping concentration of the first guest material increases. As a result, power efficiency is not likely to be improved. Therefore, in the invention, it is preferable that the first guest material be doped at low concentration in terms of low voltage driving and an improvement in power efficiency. For example, the first guest material may have an addition concentration that is less than 0.5 mass %. The concentration of the first guest material is preferably equal to or more than 0.05 mass % and less than 0.5 mass %, and more preferably in the range of 0.08 mass % to 0.2 mass %.

In terms of low driving voltage and an improvement in power efficiency, it is preferable that guest materials other than the first guest material doped into the organic light emitting layer do not have an electron trapping property and receive singlet exciton energy generated from the host material with high efficiency. In the organic light emission according to the invention, it is preferable that the second guest material have an ionization potential (IPG2), an electron affinity (AFG2), and an optical band gap (EGG2) that satisfy Expression (3) as follows:

$$IPH \geqq IPG2, AFH \geqq AFG2, \text{ and } EGH>EGG2 \qquad (3).$$

The electron transport host material is a host material having an electron transport capability equal to or higher than hole transport capability. That is, the electron transport host material is a material satisfying the relationship hole mobility≦electron mobility.

Examples of the electron transport host material for obtaining blue to blue-green light include phenylanthracene, naphthylanthracene, a diphenylanthracene derivative, a metal complex, and a styrylarylene derivative.

Specifically, examples of the electron transport host material include 4,4'-bis(2,2'-diphenylvinyl)biphenyl (DPVBi), 2,5-bis(5-t-butyl-2-benzoxazolyl)-thiophene (BBOT), 9,10-bis(3'S'-diaryl)phenylanthracene (JBEM), 9,10-di(2-naphthyl) anthracene (ADN), 2-methyl-9,10,di(2-naphthyl)anthracene (MADN), 9,10-bis-(9,9-bis(n-propyl)fluorene-2-yl)anthracene (ADF), 9-(2-naphthyl)-10-(9,9-bis(n-propyl)-fluorene-2-yl)anthracene (ANF), 2,6-di(t-butyl)-9,10-di-[6-(t-butyl)(2-naphthyl)]anthracene (TTBADN), 2,7-bis(2,2-diphenylvinyl)-9,9'-spirobifluorene (DPVSBF), 2,2'-bis(10-phenylanthracene-9-yl)-9,9'-spirobifluorene (spiro-FPA), 9,10-bis(9,9'-spirobi[9H-fluorene]-2-yl)anthracene (spiro-anthracene), di-spiro-9,9'-di-fluorene-9'',9'''-(9,10-dihydroanthracene) (DSFA), 2,7-bis[2-(4-t-butylphenyl)pyrimidine-5-yl]-9,9'-spirobifluorene (TBPSF), Spiro-PBD, 1,3,5-tris(N-phenylbenzimidazol-2-yl)benzene (TPBI), 1,3,5-tri(1-pyrenyl)benzene (TPB3), and aluminum(III)bis(2-methyl-8-quinolinato)-4-phenylphenolate (BAlq).

The first guest material and the second guest material have an emission peak in the blue to blue-green region. The first guest material and the second guest material depend on the host material used and are selected so as to satisfy the above-mentioned Expression (1) or (3). It is preferable that the first guest material be selected so as to satisfy the above-mentioned Expression (2). Specifically, examples of the first and second guest materials include, in addition to the materials described as the host material, perylene, 2,5,8,11-tetra-t-butylperylene (TBP), 4,4'-bis[2-{4-(N,N-diphenylamino)phenyl}vinyl]biphenyl (DPAVBi), 1,4-bis[2-(3-N-ethylcarbazoryl)vinyl]benzene (BCzVB), 4,4'-bis(2-(9-ethyl-9H-carbazole-3-yl)vinyl)biphenyl (BCzVBi), 4-(di-p-tolylamino)-4'-[(di-p-tolylamino)styryl]stilbene (DPAVB), 1-4-di-[4-(N,N-di-phenyl)amino]styryl-benzene (DSA-Ph), N-(4-((E)-2-(6-((E)-4-(diphenylamino)styryl)naphthalen-2-yl)vinyl)phenyl)-N-phenylbenzenamine (N-BDAVBi), and tris(2,3-methyl-8-hydroxyquinoline) aluminum ($Alm_{23}q_3$).

It is relatively easy to find a second guest material that is combined with the electron transport host material to emit light with high efficiency. The light emitting layer is doped with 1 mass % to 10 mass % of second guest material and 0.05 mass % to 0.5 mass % of first guest material (with respect to the total mass of the light emitting layer) to obtain a blue to blue-green organic thin film element with a low voltage, high efficiency, and a long lifespan.

As described above, in order to provide two kinds of light emitting mechanisms to increase the amount of excitons generated, it is preferable that the first guest material stably trap electrons. In this case, since the host material has an electron transport property, recombination can occur in the first guest material even in a region which is away from a hole injection interface in the light emitting layer in which hole density is low and recombination is less likely to occur. In the system in which the lowest unoccupied molecular orbital (LUMO) energy levels (or electron affinities) (AFH and AFG1) of the host material and the first guest material are closest to each other, even when the guest traps electrons, the electrons are moved to the host material again in a short period of time, which is not preferable. It is preferable that the LUMO energy gap (|AFH-AFG1|) between the host material and the first guest material be approximately equal to or more than 0.2 eV.

In the invention, the HOMO levels (ionization potentials IPH, IPG1, and IPG2), the LUMO levels (electron affinities AFH, AFG1, and AFG2), and the optical band gaps (EGH, EGG1, and EGG2) of the host material and two kinds of guest materials are important. Therefore, it is necessary to measure the physical property values in advance and select an appropriate combination of the physical property values. In the measurement of the physical property values, for example, an ionization potential (energy difference from the vacuum level to the HOMO level) Ip is measured by, for example, an in-air photoelectron spectrometer AC-2 (manufactured by Riken Keiki Co., Ltd.) and optical absorption is measured by an ultraviolet visible spectrometer UV-2100PC (manufactured by Shimadzu Corporation), thereby calculating an optical band gap Eg from an absorption end. An electron affinity Af (energy difference from the vacuum level to the LUMO level) can be calculated using Eg and Ip from the following relationship: Af=Ip−Eg.

The organic EL layer may be formed by any method known in the technical field, such as a vapor deposition method.

Electron Transport Layer

In the invention, the electron transport layer may be optionally provided. The electron transport layer may be made of any of the following materials: oxadiazole derivatives, such as 2-(4-biphenylyl)-5-(4-t-butylphenyl)-1,3,4-oxadiazole (PBD) and 1,3,5-tris(4-t-butylphenyl-1,3,4-oxadiazolyl)benzene (TPOB); triazole derivatives, such as 3-phenyl-4-(1'-naphthyl)-5-phenyl-1,2,4-triazole (TAZ); triazine derivatives; thiophene derivatives, such as 5,5'-bis(dimesitylboryl)-2,2'-bithiophene (BMB-2T) and 5,5'-bis(dimesitylboryl)-2,2':5',2''-terthiophene (BMB-3T); aluminum complexes, such as aluminum tris(8-quinolinolate) ($Alq_3$); phenanthroline derivatives, such as 4,7-diphenyl-1,10-phenanthroline (BPhen) and 2,9-dimethyl-4,7-diphenyl-1,10-phenanthroline (BCP); silole derivatives, such as 2,5-di-(3-biphenyl)-1,1-dimethyl-3,4-diphenylsilacyclopentadiene (PPSPP), 1,2-bis(1-methyl-2,3,4,5-tetraphenylsilacyclopentadienyl)ethane (2PSP), and 2,5-bis-(2,2-bipyridin-6-yl)-1,1-dimethyl-3,4-diphenylsilacyclopentadiene (PyPySPyPy); and imidazole compounds, such as 1,3,5-tris(N-phenylbenzimidazole-2-yl)benzene (TPBI). The electron transport layer may be formed by any method known in the technical field, such as a vapor deposition method.

In the invention, when the main charge moved in the light emitting layer is an electron, high emission efficiency and a long lifespan are obtained by the first and second dopants. Therefore, when an electron transport layer material having high electron transport capability, such as a phenanthroline derivative, a cyclic derivative, or an imidazole compound, is used, the effect is more noticeable, and the electron transport layer material is suitable for manufacturing an element with high power efficiency at a low driving voltage.

Electron Injection Layer

In the invention, an electron injection layer may be optionally provided between the cathode and the electron transport layer or between the cathode and the light emitting layer, and may be made of an insulator or a semiconductor. The electron injection layer is effective in accelerating the movement of electrons from the cathode to the light emitting layer.

In general, the electron injection layer may be made of any of the following materials: alkali metal chalcogenides and alkali metal oxides, such as $Li_2O$, LiO, $Na_2S$, $Na_2Se$, and NaO; alkaline earth metal chalcogenides and alkaline earth metal oxides, such as CaO, BaO, SrO, BeO, BaS, and CaSe; alkali metal halides, such as LiF, NaF, KF, CsF, LiCl, KCl, and NaCl; alkaline earth metal halides, such as $CaF_2$, $BaF_2$, $SrF_2$, $MgF_2$, and $BeF_2$; and alkaline metal carbonates, such as $Cs_2CO_3$. When the electron injection layer is made of these materials, it is desirable that the thickness of the electron injection layer be in the range of about 0.5 nm to about 1.0 nm. Alternatively, a thin film (a thickness of about 1.0 nm to about 5.0 nm) made of alkali metal, such as Li, Na, K, or Cs, or alkaline earth metal, such as Ca, Ba, Sr, or Mg, may be used as the electron injection layer.

Alternatively, the electron injection layer may be made of a material obtained by doping the materials used to form the electron transport layer with alkali metal, such as Li, Na, K, or Cs, an alkali metal halide, such as LiF, NaF, KF, or CsF, or an alkali metal carbonate, such as $Cs_2CO_3$.

The electron injection layer may be formed by any method known in the technical field, such as a vapor deposition method.

Metal Electrode (Cathode)

The metal electrode may be made of high-reflectance metal (for example, Al, Ag, Mo, W, Ni, or Cr), an amorphous alloy (for example, NiP, NiB, CrP, or CrB), or a microcrystalline alloy (for example, NiAl). The metal electrode may be formed by a dry process, such as a vapor deposition method or a sputtering method.

EXAMPLES

Next, the invention will be described in detail with reference to examples.

Example 1

Manufacture of Transparent Electrode

An ITO film was formed with a thickness of 180 nm on a glass substrate (length 50 mm×width 50 mm×thickness 0.7 mm; EAGLE 2000 glass manufactured by Corning Inc.) by a DC magnetron sputtering method at a set substrate temperature of 200° C. and then patterned by a so-called photolithography method to form an electrode pattern with a line width of 2 mm.

Next, the procedure of the photolithography method will be described briefly. A photoresist, FR-1250 manufactured by Tokyo Ohka Kogyo Co., Ltd., was applied with a thickness of 1.1 μm onto the substrate having the ITO film formed thereon by a spin coating method. The substrate having the photoresist formed thereon was exposed to a high-pressure mercury lamp through a photomask for forming the shadow of a line width of 2 mm using a mask aligner. Then, the substrate was developed with a developing solution, NMD-3 manufactured by Tokyo Ohka Kogyo Co., Ltd., was rinsed with pure water, and was heated in a clean oven at a temperature of 80° C. for 20 minutes in a nitrogen atmosphere, thereby forming a photoresist pattern with a line width of 2 mm on the ITO film. Then, the substrate was dipped into an oxalic acid aqueous solution at a temperature of 45° C. to etch an unnecessary portion of the ITO film. After etching, the substrate was rinsed with pure water, was dried in a nitrogen atmosphere, and was dipped into a peeling solution 106 (trademark; manufactured by Tokyo Ohka Kogyo Co., Ltd.) to peel off the resist. Then, the substrate was rinsed with pure water and was dried in a nitrogen atmosphere. In this way, the substrate having a transparent electrode formed thereon was obtained.

Manufacture of Organic EL Layer and Metal Electrode

A UV/O$_3$ cleaner, UV-1 manufactured by Samco International, Inc., was used to clean the surface of the transparent electrode pattern, and the glass substrate with the transparent electrode was introduced into a resistance heating vapor deposition apparatus. Then, a hole injection layer, a hole transport layer, an organic light emitting layer, and an electron injection layer were sequentially formed on the substrate under vacuum.

When the layers were formed, the internal pressure of the vacuum chamber was reduced to 1×10$^{-4}$ Pa or less. The hole injection layer was formed by depositing 2-TNATA with a thickness of 20 nm at a deposition rate of 1 Å/s. Subsequent to the hole injection layer, the hole transport layer was formed by depositing NPB with a thickness of 40 nm at a deposition rate of 1 Å/s. The light emitting layer was formed by a co-evaporation method that deposited ADN (IPH=5.8 eV and AFH=2.8 eV) as the host material, Alm$_{23}$q$_3$ (IPG1=5.8 eV and AFG1=2.9 eV) as the first guest material, and DPAVBi (IPG2=5.4 eV and AFG2=2.6 eV) as the second guest material at the same time.

The ionization potential (HOMO level) (IPH, IPG1, and IPG2) of each material was measured by the in-air photoelectron spectrometer AC-2 (manufactured by Riken Keiki Co., Ltd.). The optical band gaps (EGH, EGG1, and EGG2) obtained by the absorption spectrum of the same film were measured. The measured values of the ionization potential and the optical band gaps were used to calculate electron affinities (LUMO levels) (AFH, AFG1, and AFG2). The deposition rate of ADN was set to 2.0 Å/s, the deposition rate of DPAVBi was set to 0.06 Å/s, and the deposition rate of Alm$_{23}$q$_3$ was set to 0.002 Å/s. The co-evaporated organic light emitting layer was formed such that the thickness of the host material was 35 nm. At that time, since the deposition rate of Alm$_{23}$q$_3$ was much lower than those of the other materials, a film thickness meter was disposed close to a deposition source to increase detection sensitivity, thereby adjusting the deposition rate. In this case, the component ratio of the organic light emitting layer was as follows: DPAVBi was 2.9 vol % (2.4 mass %) and Alm$_{23}$q$_3$ was 0.1 vol % (0.1 mass %). The electron transport layer was formed by depositing TPBI with a thickness of 20 nm at a deposition rate of 1 Å/s.

After TPBI was deposited to form the electron transport layer, the substrate was moved to a chamber for depositing a metal film under vacuum. Then, LiF was deposited with a thickness of 1 nm at a deposition rate of 1 Å/s using a metal mask having a stripe opening pattern with a width of 2 mm in a direction vertical to the line pattern of ITO, thereby forming an electron injection layer. Then, Al was deposited with a thickness of 100 nm on the electron injection layer at a deposition rate of 3 Å/s, thereby forming a metal electrode (cathode).

The substrate having the cathode formed thereon was moved into a glove box in a dried nitrogen atmosphere (oxygen: 10 ppm or less, and water: 1 ppm or less), without contacting air. In the glove box, a sealing glass plate (length 41 mm×width 41 mm×thickness 1.1 mm; OA-10 manufactured by Nippon Electric Glass Co., Ltd.) having an epoxy-based adhesive applied to the vicinities of four corners was adhered to a sample so as to cover the organic EL layer, thereby obtaining a blue organic light emitting element according to Example 1.

Example 2

A blue organic light emitting element was obtained by the same method as that according to Example 1 except that the deposition rate of Alm$_{23}$q$_3$ was 0.006 Å/s when the organic light emitting layer was formed. In this case, the component ratio of the organic light emitting layer was as follows: DPAVBi was 2.9 vol % (2.4 mass %) and Alm$_{23}$q$_3$ was 0.3 vol % (0.3 mass %).

Example 3

A blue organic light emitting element was obtained by the same method as that according to Example 1 except that the deposition rate of Alm$_{23}$q$_3$ was 0.01 Å/s when the organic light emitting layer was formed. In this case, the component ratio of the organic light emitting layer was as follows: DPAVBi was 2.9 vol % (2.4 mass %) and Alm$_{23}$q$_3$ was 0.5 vol % (0.5 mass %).

Comparative Example 1

An organic light emitting element was formed by the same method as that according to Example 1 except that Alm$_{23}$q$_3$ was used when the organic light emitting layer was formed.

Comparative Example 2

An organic light emitting element was formed by the same method as that according to Example 1 except that DSA-ph (IPG1=5.4 eV and AFG1=2.7 eV) was used instead of Alm$_{23}$q$_3$ when the organic light emitting layer was formed.

Comparative Example 3

An organic light emitting element was formed by the same method as that according to Example 1 except that the deposition rate of Alm$_{23}$q$_3$ was 0.06 Å/s and DPAVBi was not used when the organic light emitting layer was formed.

Evaluation

The voltage, current, and brightness characteristics of the organic light emitting elements manufactured in each example and comparative example were evaluated. Table 1 shows the characteristics when the current density is 10 mA/cm$^2$.

TABLE 1

| Sample | Concentration of first guest material (%) | Concentration of second guest material (%) | Voltage | Efficiency |
|---|---|---|---|---|
| Example 1 | Alm$_{23}$q$_3$, 0.1% | DPAVBi, 2.9% | 6.8 V | 8.8 cd/A |
| Example 2 | Alm$_{23}$q$_3$, 0.3% | DPAVBi, 2.9% | 6.9 V | 8.9 cd/A |
| Example 3 | Alm$_{23}$q$_3$, 0.5% | DPAVBi, 2.9% | 7.2 V | 9.1 cd/A |
| Comparative Example 1 | — | DPAVBi, 3% | 6.8 V | 7.2 cd/A |
| Comparative Example 2 | DSA-Ph, 0.1% | DPAVBi, 2.9% | 6.8 V | 7.3 cd/A |
| Comparative Example 3 | Alm$_{23}$q$_3$, 3% | — | 7.8 V | 6.2 cd/A |

In Examples 1 to 3, Alm$_{23}$q$_3$ functions as the first guest material satisfying Expression (1) and DPAVBi functions as the second guest material satisfying Expression (3). The emission efficiency of the organic light emitting elements according to Examples 1, 2, and 3 including both the first and second guest materials is improved, as compared to the element according to Comparative example 1.

As can be seen from the results of Comparative example 2, even when 0.1% of guest material (in Comparative Example 2, DSA-Ph) satisfying Expression (1) is doped, the performance is hardly affected. In addition, as can be seen from the results of Comparative Example 3, when only the first guest material $Alm_{23}q_3$ satisfying Expression (1) is doped at conventional concentration, the driving voltage increases. As can be seen from Table 1, the driving voltage is slightly high in Example 3 and, when the first guest material of less than 0.5% is added, an increase in the voltage is prevented and the emission efficiency is improved.

The invention claimed is:

1. An organic light emitting element, comprising:
a pair of electrodes at least one of which has visible light transmittance; and
an organic EL layer provided between the pair of electrodes that includes at least an organic light emitting layer that emits light when a voltage is applied between the pair of electrodes, the organic light emitting layer including:
an electron transport host material that has a first ionization potential (IPH) and a first electron affinity (AFH); and
first and second guest materials each of which has an emission peak in a blue to blue-green color region, the first guest material having a second ionization potential (IPG1) and a second electron affinity (AFG1), and
wherein the first and second ionization potentials and the first and second electron affinities satisfy Expression (1) as follows:

$$IPH \leq IPG1 \text{ and } AFH < AFG1 \qquad (1).$$

2. The organic light emitting element according to claim 1, wherein the electron transport host material has a first optical band gap (EGH), wherein the first guest material has a second optical band gap (EGG1), and wherein the first and second optical band gaps satisfy Expression (2) as follows:

$$EGH > EGG1 \qquad (2).$$

3. The organic light emitting element according to claim 2, wherein the second guest material has a third ionization potential (IPG2), a third electron affinity (AFG2), and a third optical band gap (EGG2), and wherein the first and third ionization potentials, the first and third electron affinities, and the first and third optical band gaps satisfy Expression (3) as follows:

$$IPH \geq IPG2, AFH \geq AFG2, \text{ and } EGH > EGG2 \qquad (3).$$

4. The organic light emitting element according to claim 2, wherein the first guest material has a concentration that is less than 0.5 mass % with respect to total mass of the light emitting layer.

5. The organic light emitting element according to claim 1, wherein the second guest material has a third ionization potential (IPG2), a third electron affinity (AFG2), and a third optical band gap (EGG2), and wherein the first and third ionization potentials, the first and third electron affinities, and the first and third optical band gaps satisfy Expression (3) as follows:

$$IPH \geq IPG2, AFH \geq AFG2, \text{ and } EGH > EGG2 \qquad (3).$$

6. The organic light emitting element according to claim 1, wherein the first guest material has a concentration that is less than 0.5 mass % with respect to total mass of the light emitting layer.

* * * * *